(12) United States Patent
Sheck

(10) Patent No.: US 6,452,284 B1
(45) Date of Patent: Sep. 17, 2002

(54) SEMICONDUCTOR DEVICE SUBSTRATE AND A PROCESS FOR ALTERING A SEMICONDUCTOR DEVICE

(75) Inventor: Stephen G. Sheck, Marble Falls, TX (US)

(73) Assignee: Motorola, Inc., Schaumburg, IL (US)

(*) Notice: Subject to any disclaimer, the term of this patent is extended or adjusted under 35 U.S.C. 154(b) by 51 days.

(21) Appl. No.: 09/599,419

(22) Filed: Jun. 22, 2000

(51) Int. Cl.[7] .............................. H01L 23/544
(52) U.S. Cl. ................................. 257/797
(58) Field of Search ........................ 257/297

(56) References Cited

U.S. PATENT DOCUMENTS

| | | | |
|---|---|---|---|
| 5,311,061 A | 5/1994 | Sheck | 257/797 |
| 5,701,013 A | * 12/1997 | Hsia et al. | 250/491.1 |
| 5,760,483 A | * 6/1998 | Bruce et al. | 257/797 |
| 6,081,040 A | * 6/2000 | Okuda et al. | 257/797 |
| 6,157,087 A | * 12/2000 | Zhao et al. | 257/797 |

FOREIGN PATENT DOCUMENTS

JP          04-13349 A  *  5/1992  ................ 257/797

* cited by examiner

*Primary Examiner*—Howard Weiss
(74) *Attorney, Agent, or Firm*—George R. Meyer; Robert A. Rodriguez (57) ABSTRACT

A semiconductor device substrate (600, 900) includes a semiconductor device (310, 314, 405, 424, 506, 912, 914, 918) and an alignment structure (508, 902) lying near the semiconductor device. The substrate (600, 900) includes a reflective layer (506, 510) and an antireflective layer (316, 926). The antireflective layer (316, 926) has a positional relationship with respect to the reflective layer (506, 510). The positional relationship is either such that the antireflective layer (316, 926) overlies all the reflective layer (506, 510) or such that none of the antireflective layer (316, 926) overlies the reflective layer (506, 510). The alignment structure (508, 902) includes an alignment feature (512), such as an alignment key. The alignment structure (508, 902) allows for detection of contrasting light reflecting differentials as a continuous wave laser is targeted at the reflective layer (506, 510) and moved to the alignment feature (512), in order to improve precision of alignment in manufacturing operations.

11 Claims, 6 Drawing Sheets

SEMICONDUCTOR DEVICE SUBSTRATE AND A PROCESS FOR ALTERING A SEMICONDUCTOR DEVICE

CROSS REFERENCE TO RELATED PATENT

The present application is related to U.S. Pat. No. 5,311,061, issued on May 10, 1994, entitled "Alignment Key for a Semiconductor Device Having a Seal Against Ionic Contamination," which is assigned to the current assignee hereof and incorporated herein by reference.

FIELD OF THE INVENTION

The invention relates generally to semiconductor devices and, more particularly, alignment features used for aligning a semiconductor device substrate.

RELATED ART

In semiconductor manufacture, it is often important in process steps to accurately align the semiconductor device before performing an operation. For example, accurate alignment is important in laser fusing and laser annealing. Such process steps are typically employed in repair, hard coding of logic, and other steps.

In order to accurately align the semiconductor device, laser optics are conventionally employed and alignment aids or features formed for such purpose. The alignment aids or features can include various geometric configurations, such, as substantially L-shaped or T-shaped marks or slots. A low-power, continuous wave laser beam is passed in two directions over the alignment aid. In the alignment process, the optics detect laser reflections at high and low intensity levels, and the laser tool is positioned consistent therewith. The continuous wave laser energy and the optics detect a center point of the alignment aid or mark and adjustment of laser position is made to correspond with the center point detection. Typically, at least one other alignment aid at a different location is analyzed in a similar manner to establish reference points for moving to desired positions on the semiconductor wafer for laser fusing or annealing.

Figure 1:
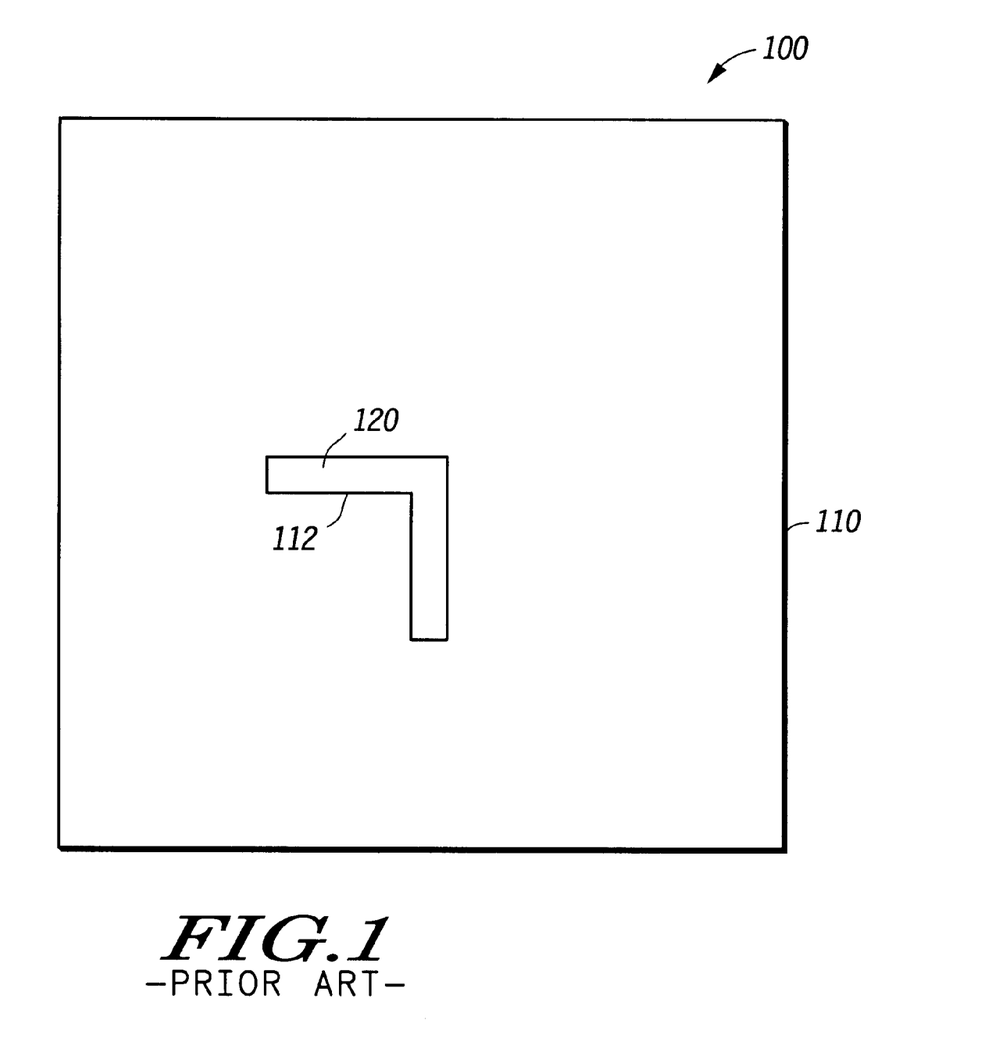
FIG. 1 includes an illustration of a top view of a prior art alignment structure.

Alignment structures may take a variety of different forms. FIG. 1 includes a conventional alignment aid, which is identified as alignment structure 100. The alignment structure 100 is formed from an uppermost conductor 110 of a semiconductor device. The uppermost conductor 110 overlies a plurality of oxide layers 120, each of which is not a reflective layer. In this particular alignment configuration, the alignment structure 100 includes an alignment key 112, in this instance an L-shaped slot in the uppermost conductor 110. In an alignment operation, the laser beam is reflected as it passes across the uppermost conductor 10, but reflection is significantly less when the laser beam passes across the plurality of oxide layers 120.

U.S. Pat. No. 5,311,061, issued May 10, 1994, entitled "Alignment Key for a Semiconductor Device Having a Seal Against Ionic Contamination" discloses a type of alignment structure in a semiconductor substrate that, in essence, forms a box. Referring to FIG. 4—4 of that patent, the box is fabricated to prevent diffusion of mobile ionic contaminants through the alignment key into other portions of the semiconductor substrate. Typically, the structure is somewhat larger than the alignment feature. However, an area around the structure may be exposed to the laser beam during aligning. If floating gate memory cells lie too close to the alignment structure during alignment, a programmed memory cell may be disturbed. Therefore, an area having approximately 200 microns ($\mu$m) per side surrounds the center point of the structure. No electrical components are placed within that area, and therefore, a significant amount of substrate area is wasted as unusable for location of electronic components.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

An improved alignment structure allows for better detection of contrasting reflecting radiation differentials, in order to improve precision of device alignment in manufacturing operations. In alignment of substrates or devices, such as for laser fusing or laser annealing steps, a continuous wave laser is employed with optics for detecting reflecting levels in one embodiment. The alignment structure is formed with an anti-reflective coating or layer contained within the alignment key, a via wall, substantially conforming to the key to contain mobile ions, and a large uppermost shield or plate structure, which is a reflective layer, to facilitate detection of the alignment structure and to protect underlying substrate configurations. The large uppermost shield, the anti-reflective coating, and the via wall allows for location of active and passive electric components within the device, closely adjacent to and below the alignment structure.

Figure 2:
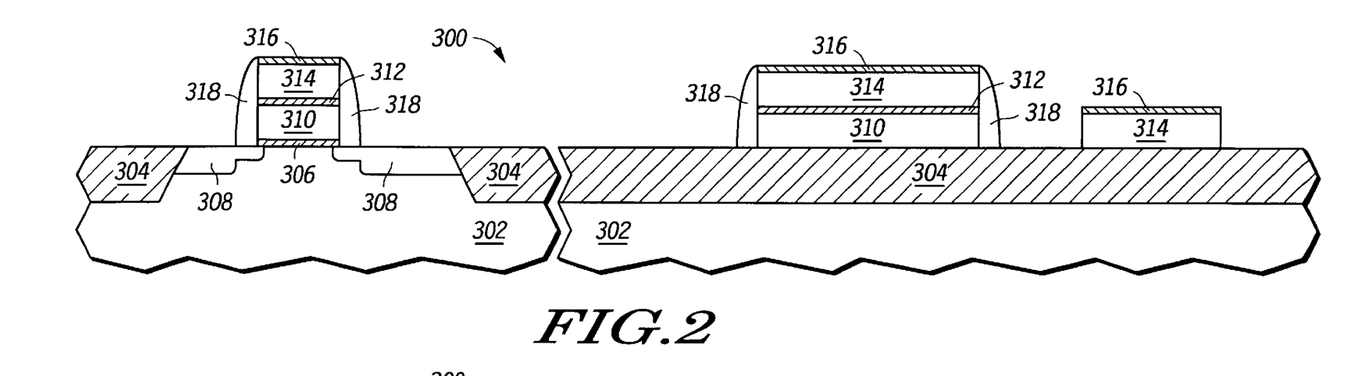
FIG. 2 includes an illustration of a cross-sectional view of a portion of a semiconductor device substrate at an early stage of formation of a semiconductor device.
Figure 3:
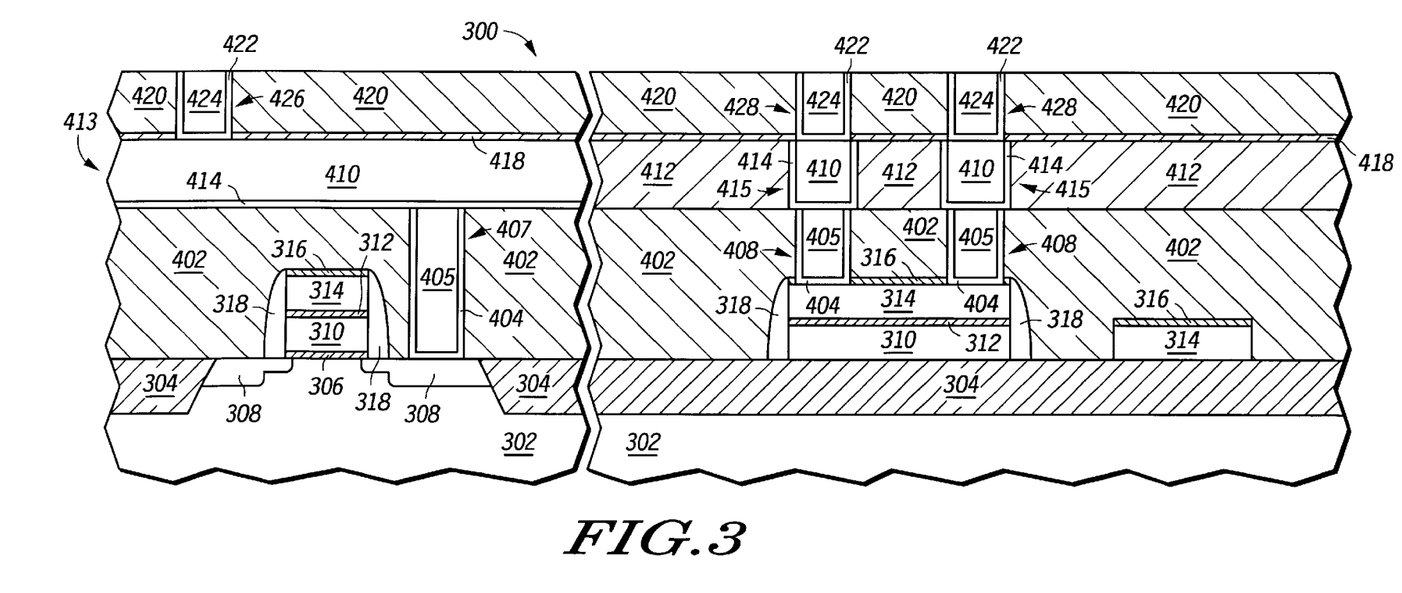
FIG. 3 includes an illustration of a cross section of the semiconductor device of FIG. 2 after deposition of further intermediate layers.

Referring to FIG. 2, an early-stage semiconductor device 300 includes a semiconductor device substrate 302 that may be a monocrystalline semiconductor wafer, a semiconductor-on-insulator (SOI) substrate, or any other substrate suitable for use to form semiconductor devices. The device 300 is at an intermediate, but early, stage of the semiconductor manufacture process, having progressed through several processing steps, as those skilled in the art know and appreciate. Although specific configurations of the device 300 are shown in FIG. 3, the configurations are intended only as examples of the possibilities and the configurations are subject to wide variation and possibility, as is conventional.

The device 300 is formed with field isolation regions 304. A gate dielectric layer 306 is formed over an active region, which includes doped regions 308 of the device 300. The gate dielectric layer 306 is an oxide or oxide/nitride combination. A floating gate 310 is formed atop the gate dielectric layer 306. The floating gate 310 includes a polysilicon (poly) or polysilicide material. The floating gate 310 material is also formed in other locations of the device 300, for, example, over the field isolation region 304. An oxide-nitride-oxide (ONO) layer 312 is formed atop the floating gate 310.

Atop the ONO layer 312, a control gate 314 is formed. The control gate 314 is a poly or polysilicide material and is reflective to radiation used in a subsequent aligning operation. The control gate 314 material may also be located in other regions of the device 300, such as over the field isolation region 304. A silicon nitride layer 316 is formed atop the control gate 314 and serves as an insulator. The nitride layer 316 can serve as an anti-reflective layer. Anti-reflective layers are employed, as hereafter more fully described, for obtaining high contrast light reflectivity differentials in alignment operations with alignment structures, using a continuous wave laser to target the alignment structures and detect reflectivity. The anti-reflective layer can have a thickness and shape as desired for a particular device. For example, the anti-reflective layer can have a thickness of no greater than approximately 50 nm.

The shape of the anti-reflective layer can substantially conform to a desired shape of the alignment structure. For example, the anti-reflective layer and the outer periphery of the finished alignment structure (current structure is only partially completed) are both L-shaped. A sidewall spacer 318 of oxide abuts the gate structures.

Referring to FIG. 3, the device 300 is further processed and includes additional structures. A first intermediate dielectric layer 402 covers the device 400. The first intermediate dielectric layer 402 is formed, for example, of a silicon dioxide (SiO$_2$) material or other compounds having insulative properties. Openings are formed in select locations of the first intermediate dielectric layer 402. The openings are lined with an adhesion/barrier layer 404. A conductive fill material 406 is formed to fill the openings. Any portion of the conductive fill material overlying the first intermediate dielectric layer 402 is removed by etching or chemical-mechanical polishing. The conductive fill material is mostly aluminum, copper, tungsten, or the like. The adhesion/barrier layer 404 is formed, for example, of titanium or titanium nitride if the conductive fill material is mostly aluminum or tungsten or of tantalum or tantalum nitride if the conductive fill material is copper.

At this point in the process, contact plug 407 and conductive plug 408 has been formed. Other contact plugs similar to contact plug 407 are formed to make electrical connections to other portions of the device 300. The shape of the conductive plug 408 will be discussed in more detail with respect to FIG. 7.

A second intermediate dielectric layer 412 is formed atop the first intermediate dielectric layer 402. Openings are made in the second intermediate dielectric layer 412. The openings are then internally coated with a next adhesion/ barrier film 414. A second conductive fill material 410 fills the openings. The second conductive fill material 410 is a highly conductive material, such as aluminum, copper, or other conductor. Any portion of the second conductive fill material 410 overlying the second intermediate dielectric layer 412 are removed by etching or polishing. At this point in the process, an interconnect 413 and a conductive plug 415 are formed. Other interconnects are formed but are not shown in FIG. 3.

An optional capping or etch-stop layer 418 (typically a nitride) is formed over the second intermediate dielectric layer 412 to complete the encapsulation of the second conductive fill material 410. Next, the third intermediate dielectric layer 420 is formed. Openings are formed in the third intermediate dielectric layer 420 and the layer 418 in a conventional manner in order to expose the underlying second conductive fill material 410. The openings are lined with a third adhesion/barrier film 422 and filled with a third conductive fill material 424 including aluminum, copper, tungsten, or other conductor. A via plug 426 and a conductive plug 428 have been formed. Other via plugs similar to via plug 426 are formed but are not shown in FIG. 3.

Figure 4:
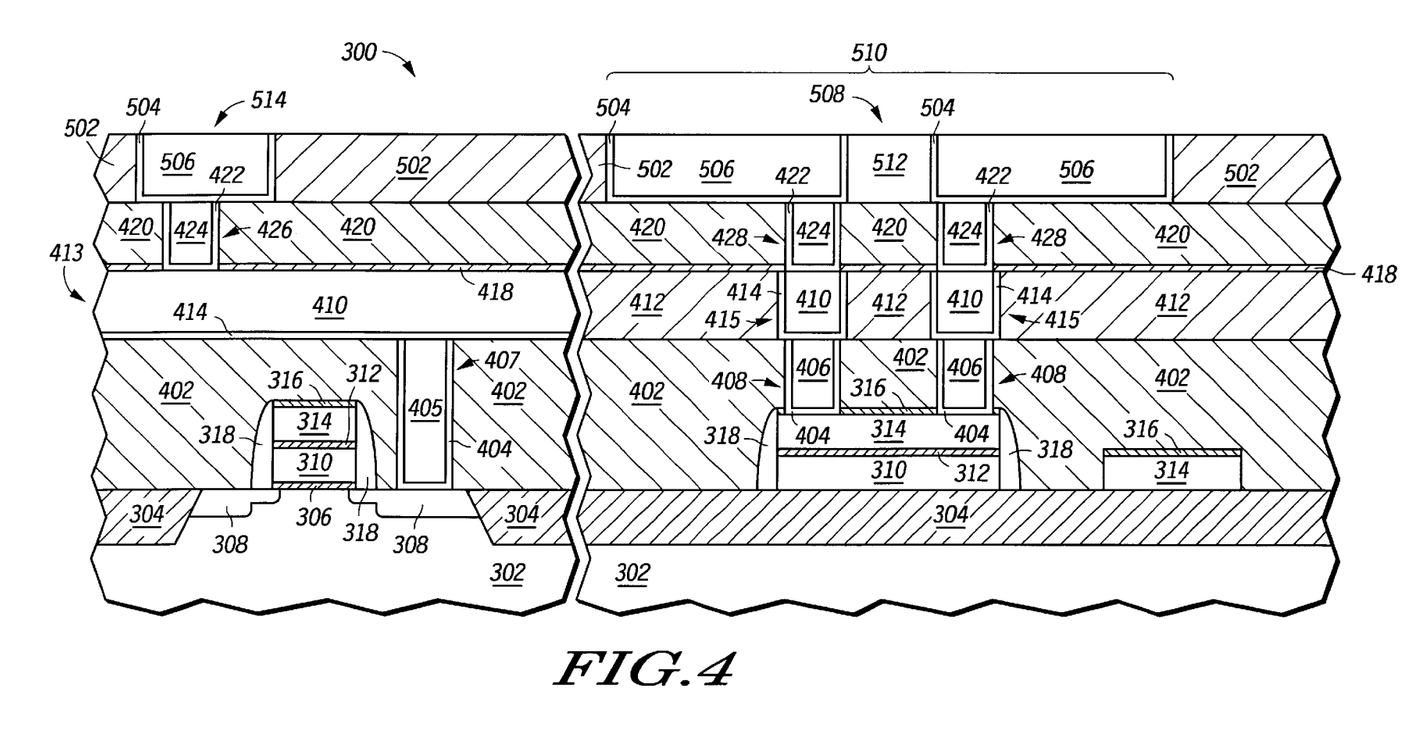
FIG. 4 includes an illustration of a cross section of the semiconductor device of FIG. 3 after deposition of an uppermost conductor and upper dielectric layer and showing formation of an alignment structure in accordance with an embodiment of the present invention.

Referring to FIG. 4, the semiconductor device 300 is further processed to form a fourth dielectric layer 502. Openings are formed in the fourth dielectric layer 502. A fourth adhesion/barrier film 504 and a fourth conductive fill material 506 are formed within the opening. Portions of film 504 and material 506 that lie outside the openings are removed by etching or polishing. A second level interconnect 514 and an alignment plate 510, which includes a reflective layer, have been formed. Pads and other interconnects similar to interconnect 514 are also formed but not shown in FIG. 4. At this point in time, most of the formation of the alignment structure 508 has been completed. The shape and functional discussion of the alignment structure will be discussed after the rest of the processing steps to form the device 300 are discussed.

Figure 5:
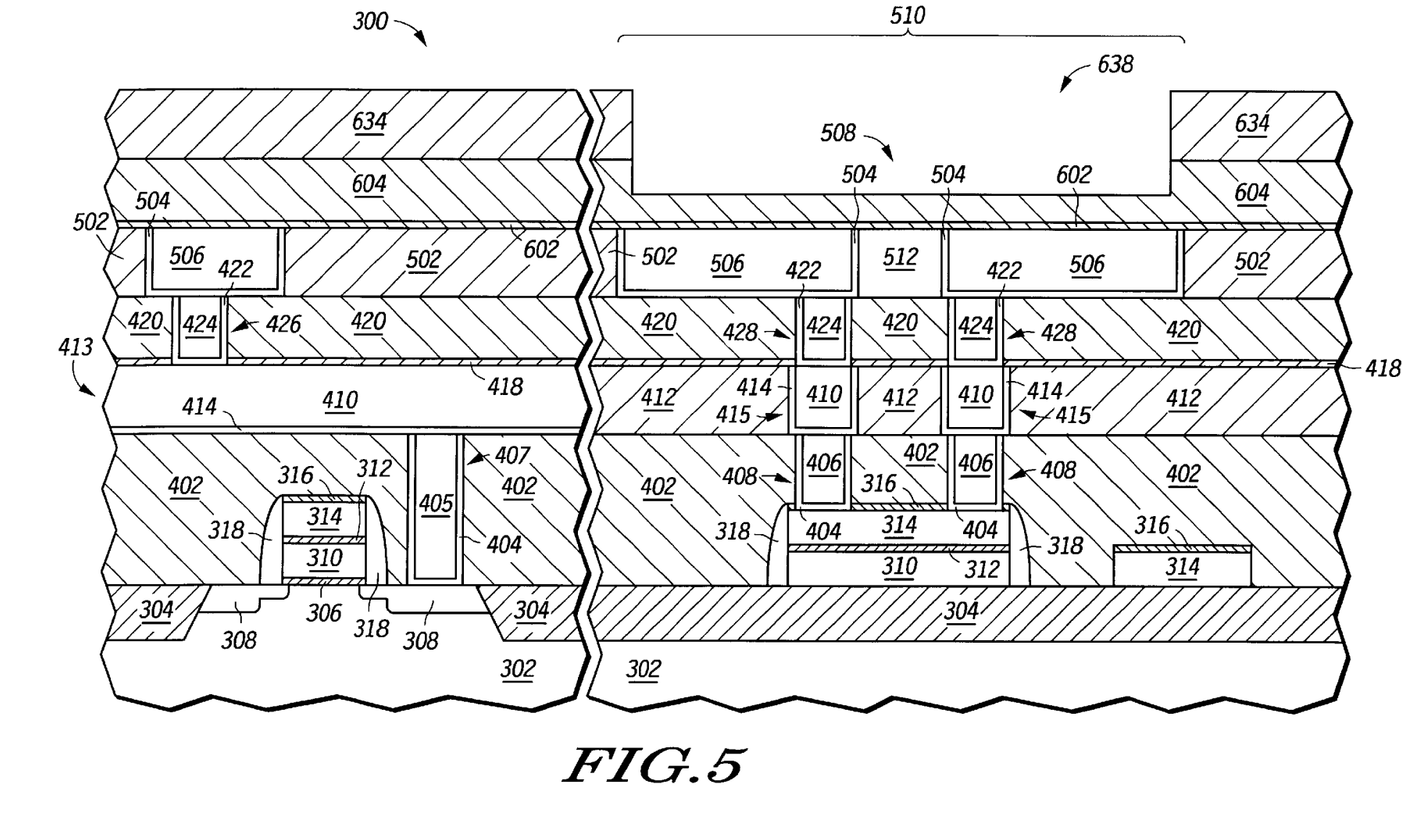
FIG. 5 includes an illustration of a cross section of the semiconductor device of FIG. 4 after patterning of a passivation layer to expose a portion of the alignment structure in accordance with an embodiment of the present invention.

A second capping layer 602 and a passivation layer 604 is formed over the interconnect 514, alignment structure 508, and the fourth dielectric layer 504 as shown in FIG. 5. A photoresist layer (not shown) is formed with openings over the bond pads (not shown). Most of the exposed portions of the passivation layer 604 are removed by etching. In this embodiment, openings in the photoresist layer (not shown) are not present over the alignment structure 508 during the etch. Therefore, substantially none of the passivation layer 604 and second capping layer 602 is removed over the alignment structure 508 during the etch. The photoresist layer (not shown) is then removed.

A polyimide layer 634 is formed by coating the substrate 302 and patterning it using a different photoresist layer (not shown) that has an opening over the alignment structure 508. The polyimide layer 634 and portions of the passivation layer 604 and second capping layer 602 are removed. For bond pad areas (not shown), the entire thicknesses of the polyimide 634, remaining portions of the passivation layer 604, and second capping layer 602 are removed by etching to expose the bond pads (not shown). For the area near the alignment structure 508 and fuses (not shown), window 638 is formed over the alignment structure. The etching steps that are used to remaining portions of the passivation layer 604 and second capping layer 602 over the bond pads (not shown) remove some of the passivation layer 604 over the alignment structure 508.

Typically, approximately 100–300 nm of the, passivation layer 604 remains over the alignment structure 508. The thickness of the passivation layer 604 and second capping layer 602 over the alignment structure 508 should be sufficient to provide adequate protection against contamination (e.g., water, mobile ions, etc.) but not be too thick to adversely affect a laser operation used to electrically open a circuit at a fuse. In one embodiment, the second capping layer 602 has a thickness in a range of approximately 30–70 nm, and the passivation layer has a thickness in a range of approximately 400–500 nm. About 25–75% of the entire thickness of the passivation layer 604 is removed over the alignment structure 508 and fuses (not shown). In still other embodiments, all or none of the passivation layer 604 may be removed. These numbers are examples and not meant to limit the scope of the invention.

Referring to FIG. 5, portions of the alignment plate 510 and conductive plugs 428, 415, and 408, and control gate 314 define a containment well. The well helps to contain laser energy during a fuse alignment operation. This can reduce the likelihood of disturbing data within structures (e.g., memory cells etc.) within the device. Because portions of passivation layer 604 are removed, the combination of elements is similar to a conventional edge-ring seal for the semiconductor device. Therefore, if contaminants or other impurities were present, they may be contained within the containment well instead of migrating through the dielectric layer and potentially causing a reliability failure. Therefore, the well can be implemented for various reasons.

Figure 6:
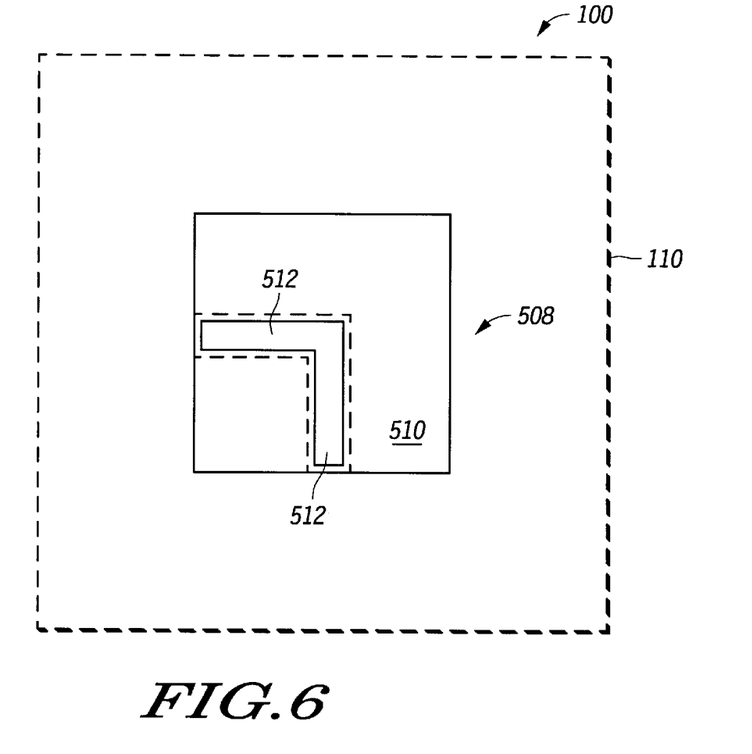
FIG. 6 includes an illustration of a top view of the alignment structure of an embodiment of the present invention, showing, in dashed lines, a prior art alignment structure for relative size and positional relationship comparison.

In FIG. 6, the alignment structure 508 is significantly smaller than the one illustrated in FIG. 1. As a reference, the outer perimeter of the alignment structure 100 is illustrated with a dashed line. From the figure, it is understandable that significantly greater substrate device geography (i.e., area) is occupied by the alignment structure 100 than by the alignment structure 508. The dashed line within the alignment structure 508 corresponds to the outer edge of the containment wall under the uppermost conductive layer. On the other hand, the outer edge of the containment wall in the alignment structure 100 lies along the outer edges of the uppermost conductor. More underlying area in structure 508 is freed up for other uses.

During an aligning process, a radiation source will scan a portion of the device 300 and the alignment structure 508. Typically, a relatively low power laser will be used during the scanning of the alignment structure. The laser beam exhibits high reflectivity when targeting metal or other reflective material of the alignment plate 510 of the alignment structure 508 but exhibits low reflectivity when targeting the region 512. In this particular embodiment, the capping layer 418 and antireflective layer 316 are nitrides. Therefore, little radiation incident within region 512 is reflected. The reflectivity differential of high to low reflected radiation levels, as the laser beam passes over the alignment structure 508 and to the region 512 in a conventional manner, is detectable by optics. A center point of the alignment structure 508 is determined for precisely positioning the laser with respect to the semiconductor wafer, die or other piece associated with the structure 508.

Figure 7:
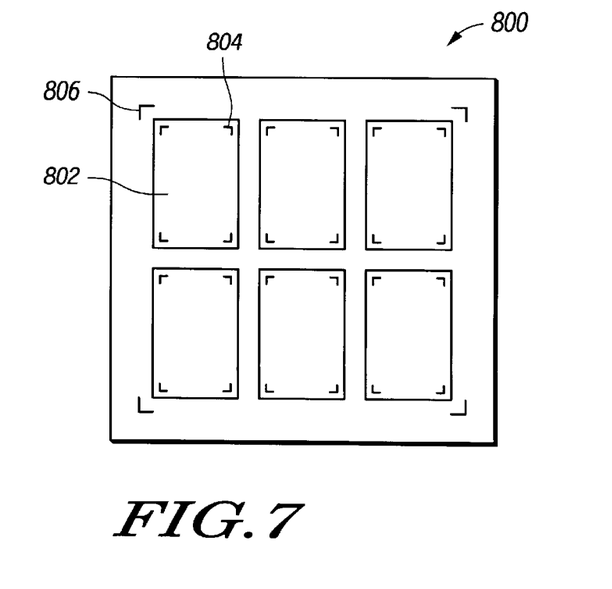
FIG. 7 includes an illustration of a top view of a reticle or stepping field showing a plurality of semiconductor devices and possible positioning of alignment features therewith.

Referring to FIG. 7, a reticle field 800 includes six die 802 in a three-by-two arrangement. The reticle field 800 shows possible locations of the alignment structure 508 in the reticle field 800 within or outside the die 802. If the alignment structure 508 is located within the die 802, possible locations for the alignment structure 508 are at each of four corners of the die 802 as illustrated by alignment features 804. If the alignment structure 508 is instead located outside the die 802, possible locations for the alignment feature 508 are at each of the four corners of the reticle field 800 as illustrated by alignment features 806. Location of the alignment feature 806 in the corners of the reticle field 800 is appropriate, for example, for multiple die alignment to speed laser fusing and laser annealing processes. Typically, at least three out of four alignment features 806, on either the die 802 or the reticle field 800, are sought to be detected by continuous wave laser and optics, in making the alignment. Alternatively, fewer or more alignment features 806 or 804 could be employed. Further, it may be possible that both types of alignment features 804 and 806 can be used. For example, relatively coarser alignment can be performed using alignment features 806, and relatively finer alignment can be performed using alignment features 804. Also, alignment structures 508, can be formed in alternative locations of the die, substrate workpiece, reticle field or other associated portions.

Figure 8:
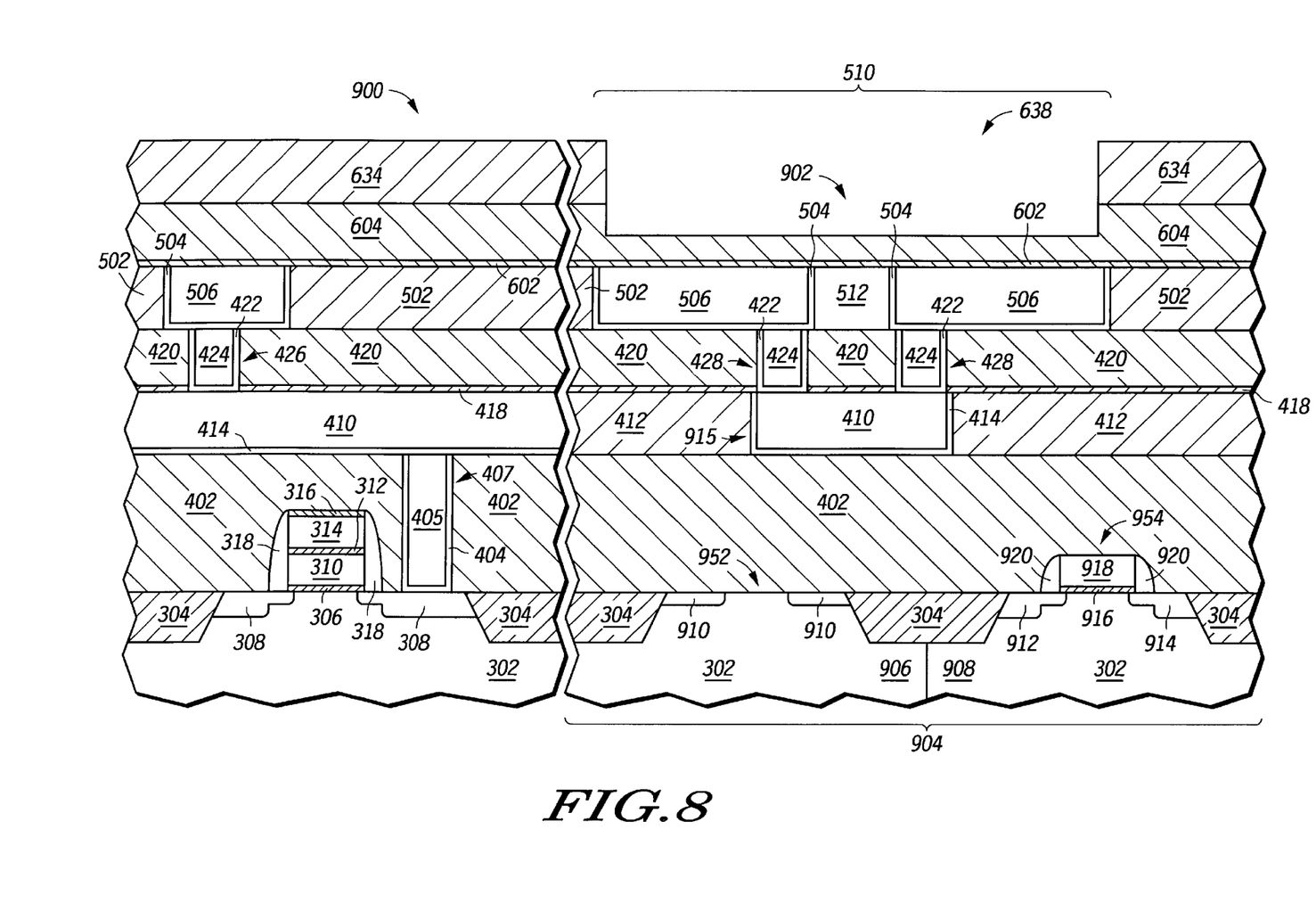
FIG. 8 includes an illustration of a cross section of a finished semiconductor device having the alignment structure of an embodiment of the present invention, illustrating the location of electrical components under and near the alignment structure.

An example of alignment structure 902 according to another embodiment of the present invention is shown in FIG. 8. Semiconductor device 900 includes various electronic components 904 including an N-well resistor 952 and a transistor 954 that lie below the alignment structure 902. The electronic components are examples only, and it is to be understood that the particular electronic components in any instance can be active, such as transistors and the like; passive, such as capacitors, resistors, or the like; topographical structures (e.g., tiles, dummy features, etc.) or the like; or more complicated electronic components including floating gate or other memory cells, latches, and others.

The components lie below the alignment structure 902 to emphasize the advantage of the alignment structure 902 of conserving valuable substrate area of the device 900 to form the alignment structure 902. Furthermore, the device 900 shows that the components may be located adjacent to and below the alignment structure 902, without detriment to the electrical and physical integrity of the device 900, because of the via wall formed of the second conductive layer 410 and the third conductive layer 424. The containment well is shallower in this embodiment because the alignment structure does not extend as close to the semiconductor device substrate as before.

In the device 900, the silicon substrate 302 includes an N-well 906 and a P-well 908. At least a portion of the resistor 952 and the transistor 954 lie within the N-well 906 and P-well 908, respectively. Field isolation regions 304 separate the wells 906 and 908 from each other and other portions of the substrate 302 near the primary surface of the substrate. In the N-well 906, doped portions 910 form ohmic contact regions for the N-well resistor 952 (resistance is primarily determined by area between the doped portions 910). In the P-well 908 portion, an active element, such as the transistor 954 is formed. A source 912 and a drain 914 are formed in conventional manner. A gate dielectric layer 916 is located over portions of the source 912 and drain 914, and a gate 918 completes the transistor. Sidewall spacers 920 and additional dielectric layers, such as the first intermediate dielectric layer 402, the second intermediate dielectric layer 412, the capping or etch-stop layer 418 (such as nitride or other ARC material), the third intermediate dielectric layer 420, the fourth dielectric layer 502, and a plasma enhanced nitride layer 602, are all formed in a conventional manner.

In the case of the alignment structure 902, in comparison to the alignment structure 508 of FIG. 5, an interconnect opening is formed in the second intermediate dielectric layer 412 in a location above the components. The bottom 915 of the alignment structure 902 includes the adhesion/barrier film 414 that lines the opening and surrounds the metal layer 410. In the third intermediate dielectric layer 420, contact openings are formed along sides of the alignment feature 512. The openings pass through the third intermediate dielectric layer 420 and the layer 418 to the metal layer 410. The openings within the third intermediate dielectric layer 420 are first lined with the adhesion/barrier film 422 and then filled by the metal layer 424 to form conductive plug 428 that defines the via wall for the structure 902.

In the alignment structure 902, portions of the nitride layer 418 atop the metal 410 are isolated from other portions of the layer 418, and are laterally disposed between and bounded by the via walls formed of the conductive plug 428. This nitride 418 acts as an anti-reflective coating (ARC) for laser light targeted through the alignment feature 512.

As with the device 300 illustrate in FIG. 5, the fourth dielectric layer 502 accommodates the upper conductive layer 506 in openings formed in the fourth dielectric layer 502. Further, the upper conductive layer 506 is topped with a plasma-enhanced nitride 602 and the passivation layer 604. The window 638 is formed in the passivation layer 604 to allow access to the alignment structure 902.

In an alignment operation involving a semiconductor device substrate with an alignment structure as herein described, the semiconductor device substrate is placed within apparatus equipped with a laser for performing operations on the device substrate. For example, such apparatus functions to, in some manner, alter the semiconductor device substrate in furtherance of manufacture. The device alterable apparatus typically includes an energy source. The semiconductor device substrate includes one or more semiconductor devices, such as a die and adjacent features. The semiconductor device substrate also includes an alignment structure lying within or near the semiconductor device, as has been described herein. The alignment structure includes an alignment feature. Also, as described herein, the alignment structure has a centerpoint, and the alignment feature has a length, a first boundary line, and a second boundary line. The first and second boundary lines are typically substantially perpendicular in orientation.

In aligning the semiconductor device in the apparatus for performing operations that alter the device, the semiconductor device must be precisely aligned within minimal tolerances, as specified by applicable design rules and the apparatus requirements. The alignment process includes steps of scanning the semiconductor device substrate. The scanning is typically performed using a continuous wave laser. Reflectivity levels of the laser light can be detected by optics. The optics detect when reflectivity is high, such as when the laser targets a reflective surface of an alignment structure, and when reflectivity is low, such as when the laser targets an anti-reflective surface, such as an alignment feature of the alignment structure.

In scanning to detect alignment, an energy beam of the laser is emitted and reaches a location along the alignment structure. The location is either a first point that lies a first distance from the centerpoint of the alignment structure, wherein the first distance is at least approximately 1.6 times the length or a second point lies within a quadrant that is defined by the first and second boundary lines. The second point lies a second distance from the alignment feature. For example, the second distance may be at least approximately 1.2 times the length from the alignment feature. Of course, other scanning and detection procedures with the alignment structure are possible as those skilled in the art will know and appreciate.

Embodiments of the present invention overcome the problems and disadvantages previously presented in the technology, and is advantageous in further respects. For example, in embodiments of the present invention, circuitry and other components, such as, for example, the electronic components 904 or others, either active or passive, may be formed adjacent to and under the alignment structure. Further, the reduced geography on the substrate required by the alignment structure allows for selective placement of the structure either on the die, or in the reticle field, where it occupies minimal geography. Also, the alignment structure may be more closely placed on or otherwise associated with the die in order to reduce alignment inaccuracies. The relative coordinates for all the fuses and the alignment structures can be mutually maintained in the same database, because of the close proximity of the alignment structures on the die. In this manner, registration errors in mask integration are avoided.

Although the foregoing specifically refers to alignment structures in which the uppermost features of the structure are non-antireflective and the alignment key includes antireflective coating materials, it is to be understood, nonetheless, that the objective of highly contrasting light reflectivity differentials can be obtained with alternatively configured structures having closely associated antireflective and non-antireflective materials for detection. For example, an alignment structure could be formed with non-antireflective materials forming the key and antireflective materials adjacent the key. Other variations are possible.

In some embodiments, radiation used during aligning is within the visible light spectrum. In other embodiments, radiation outside the visible light spectrum can be used. For example, radiation within the infrared or ultraviolet spectrum may be used. For antireflective layers, the composition and thickness of the layer should be chosen to be an antireflective layer for the wavelength of radiation used.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor alignment structure overlying a semiconductor substrate comprising:

a first anti-reflective layer at the bottom of the alignment structure;

a reflective plate at the top of the alignment structure, wherein the reflective plate includes an alignment feature opening that allows passage of laser energy onto the first anti-reflective layer; and conductive walls that extend between the reflective plate and the first anti-reflective layer, wherein the a combination of the reflective plate, the conductive walls and the first antireflective base define a reflective shield and containment well that prevents the laser energy from influencing semiconductor device circuitry associated with the semiconductor substrate.

2. The semiconductor alignment structure of claim 1, wherein the first antireflective layer has a thickness no greater than approximately 50 nm.

3. The semiconductor alignment structure of claim 1, wherein the reflective plate is coplanar with an uppermost level of interconnects associated with the semiconductor substrate.

4. The semiconductor alignment structure of claim 3, wherein the conductive walls comprise at least one conductive layer having an uppermost surface that is coplanar with one of a corresponding uppermost surface of a via structure and an interconnect structure.

5. The semiconductor alignment structure of claim 3, wherein the first antireflective layer is formed on a first conductive layer that is an earliest conductive layer formed over a semiconductor device substrate.

6. The semiconductor alignment structure of claim 5, wherein the conductive walls comprise at least three conductive levels, and wherein each one of the three conductive levels has an uppermost surface that is coplanar with one of a corresponding uppermost surface of a via structure and an interconnect structure.

7. The semiconductor alignment structure of claim 1, further comprising a second antireflective layer overlying the alignment structure.

8. The semiconductor alignment structure of claim 1 wherein an electrical component underlies at least a portion of the alignment structure, and wherein the containment well prevents laser energy from influencing an electrical characteristic of the electrical component.

9. The semiconductor alignment structure of claim 8, wherein the electrical component is selected from a group consisting of an interconnect, a transistor, a resistor, and a capacitor.

10. The semiconductor alignment structure of claim 8, wherein the electrical component underlies the reflective plate, but does not underlie an alignment feature opening in the reflective plate.

11. The semiconductor alignment structure of claim 8, wherein the electrical component, at least in part, underlies the alignment feature opening.

* * * * *

UNITED STATES PATENT AND TRADEMARK OFFICE
CERTIFICATE OF CORRECTION

PATENT NO.   : 6,452,284 B1
DATED        : September 17, 2002
INVENTOR(S)  : Stephen G. Sheck It is certified that error appears in the above-identified patent and that said Letters Patent is hereby corrected as shown below:

<u>Title page, Item [54] and Column 1, lines 2 and 3,</u>
Title, change "AND A PROCESS FOR ALTERING A SEMICONDUCTOR DEVICE" to -- WITH ALIGNMENT MARKS AND ANTIREFLECTIVE LAYERS --.

<u>Title page,</u>
Item [57], ABSTRACT,
Line 1, change "600" to -- 300 --
Line 4, change "600" to -- 300 --
Line 5, delete "926" after "316", (2 occurrences)
Line 8, delete "926" after "316",
Line 9, delete "926" after "316", .

Signed and Sealed this

Second Day of December, 2003

JAMES E. ROGAN
*Director of the United States Patent and Trademark Office*